(12) United States Patent
Mascolo et al.

(10) Patent No.: US 7,492,624 B2
(45) Date of Patent: Feb. 17, 2009

(54) METHOD AND DEVICE FOR DEMULTIPLEXING A CROSSBAR NON-VOLATILE MEMORY

(75) Inventors: Danilo Mascolo, Ercolano (IT); Gianfranco Cerofolini, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 1 day.

(21) Appl. No.: 11/771,920

(22) Filed: Jun. 29, 2007

(65) Prior Publication Data
US 2009/0003063 A1 Jan. 1, 2009

(51) Int. Cl.
*G11C 11/00* (2006.01)
(52) U.S. Cl. ........................ 365/151; 977/938
(58) Field of Classification Search .......... 365/151
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,760,245 B2 * | 7/2004 | Eaton et al. | 365/100 |
| 6,891,744 B2 * | 5/2005 | Chen et al. | 365/151 |
| 6,900,479 B2 * | 5/2005 | DeHon et al. | 257/202 |
| 7,073,157 B2 * | 7/2006 | DeHon et al. | 716/17 |
| 7,307,448 B2 * | 12/2007 | Snider et al. | 326/38 |
| 7,310,004 B2 * | 12/2007 | DeHon | 326/41 |
| 7,350,132 B2 * | 3/2008 | Kuekes et al. | 714/758 |
| 2006/0051919 A1 | 3/2006 | Mascolo et al. | |
| 2006/0051946 A1 | 3/2006 | Mascolo et al. | |
| 2006/0216897 A1 * | 9/2006 | Lee et al. | 438/282 |
| 2006/0238223 A1 * | 10/2006 | Kuekes et al. | 326/134 |
| 2006/0240681 A1 * | 10/2006 | Williams et al. | 438/800 |

FOREIGN PATENT DOCUMENTS

| | | |
|---|---|---|
| WO | 03/094171 A1 | 11/2003 |
| WO | 2005/029498 A2 | 3/2005 |

OTHER PUBLICATIONS

Austin et al., "6 nm half-pitch lines and 0.04 um2 static random access memory patterns by nanoimprint lithography," Nanotechnology, 16: 1058-1061, 2005.

(Continued)

*Primary Examiner*—Son L Mai
(74) *Attorney, Agent, or Firm*—Lisa K. Jorgenson; Robert Iannucci; Seed IP Law Group PLLC

(57) ABSTRACT

A method and device demultiplex a crossbar non-volatile memory that includes a first array of row nano-wires and a second array of column nano-wires, which cross the row nano-wires at a plurality of cross-points, hosting plural memory cells. A first electrode and a second electrode respectively cross a modulated doping portion of the row nano-wires and a modulated doping portion of the column nano-wires. A first contact and a second contact respectively the row nano-wires and the column nano-wires. The first electrode and the second electrode are biased respectively with a first and a second adjustable voltage value that progressively switch one by one said memory cells from the OFF state to the ON state, and this state can be memorized.

23 Claims, 6 Drawing Sheets

OTHER PUBLICATIONS

Beckman et al., "Bridging Dimensions: Demultiplexing Ultrahigh-Density Nanowire Circuits," Science, 310: 465-468, Oct. 21, 2005.

Bez et al., "Introduction to Flash Memory," Proceedings of the IEEE, 91(4): 489-502, Apr. 2003.

Bez et al., "Non-volatile memory technologies: emerging concepts and new materials," Materials Science in Semiconductor Processing, 7: 349-355, 2004.

Brewer et al., "Memory Technology for the Post CMOS Era," IEE Circuits & Devices Magazine, 13-20, Mar./Apr. 2005.

Cerofolini et al., "A hybrid approach to nanoelectronics," Nanotechnology, 16: 1040-1047, 2005.

Cerofolini et al., "Applicazioni non standard dei dispositivi al silicio nella rivelazione di radiazioni nucleari," Giornale di Fisica, 23(3): 201-211, 1982.

Cerofolini et al., "Strategies for nanoelectronics," Microelectronic Engineering, 81: 405-419, 2005.

DeHon et al., "Stochastic Assembly of Sublithographic Nanoscale Interfaces," IEEE Transactions on Nanotechnology, 2(3): 165-174, Sep. 2003.

Hood et al., "Systems Biology and New Technologies Enable Predictive and Preventative Medicine," Science, 306: 640-643, Oct. 22, 2004.

Luo et al., "Two-Dimensional Molecular Electronics Circuits," Chemphyschem, 3: 519-525, 2002.

Melosh et al., "Ultrahigh-Density Nanowire Lattices and Circuits," Science, 300: 112-115, Apr. 4, 2003.

Snider et al., "Nanoelectronic architectures," Appl. Phys. A, 80: 1183-1195, 2005.

* cited by examiner

METHOD AND DEVICE FOR DEMULTIPLEXING A CROSSBAR NON-VOLATILE MEMORY

BACKGROUND

1. Technical Field

The present invention relates to a method for demultiplexing a crossbar non-volatile memory.

The invention particularly, but not exclusively, relates to a method for demultiplexing a semiconductor nanometer-scale (sub-lithographic) crossbar non-volatile memory obtained by using a multispacer structure and to a device for demultiplexing a cross-bar non-volatile memory, and the following description is made with reference to this field of application for convenience of explanation only.

2. Description of the Related Art

As it is well known, in the field of memory devices, the need of realizing circuit configurations of more and more reduced sizes is particularly felt.

In particular, in recent years there has been a growing interest in scaling down the size of Flash technology for non-volatile memories. So, in consideration of the fact that a standard non-volatile memory includes one transistor per cell and in order to increase the memory integration density (number of cells per area), the size of the transistor has been reduced photo-lithographically. In fact, the cell size of a non-volatile memory has been reduced around 10 $F^2$ for NOR cells and around 4.5 $F^2$ for the NAND counterpart, F being the so called technological node.

Even if the International Technology Roadmap of Semiconductors (ITRS) in CMOS technology states that the 32 nm technology node will be introduced in 2013, there are some limiting factors for Flash memory scaling. For example, the scalability of the active dielectric layers of the cell, the so called "tunnel oxide", is limited by the cell charge retention after many writing cycles of the memory. In particular, the stress induced leakage current could cause statistic failures for oxide thickness less than 9 nm. The reading performance become worse when the oxide thickness is scaled to 6-7 nm, as in ECC (Error Code Correction) memories. More details on Flash scalability limits are described in the publication to R. Bes; E. Camerlenghi; A. Modelli; A. Visconti "Introduction to Flash Memory", IEEE Vol. 91, 4 pages (489-502) (April 2003).

In order to overcome these limitations on Flash memory scalability, different non-volatile memory layouts have been explored in the last ten years, as described in the following publication: J. B. Brewer, V. V. Zhirnov, and J. A. Hutchby, "Memory Technology for the Post CMOS era", IEEE Circuits and Device Magazine (March/April 2005).

Recent works have shown that crossbar memories are the most suitable memory layouts for obtaining a tera-scale integration level (>10 Gbit/cm$^2$). A crossbar memory comprises a two-dimensional array of a plurality of nanometer-scale devices, each device comprising a cross-point formed by a pair of crossed wires where one wire crosses another, and at least one switch connecting the pair of crossed wires in the cross-point. In this layout, the memory comprises a matrix whose elements are memory units, each of them implementing a logic function of storing information.

Some examples of crossbar memories are described in the U.S. Pat. No. 6,128,214 and in the WO patent application N.03/094171. In the US patent, a switch described as comprising a bi-stable molecular switch and junctions forming either a resistor or a diode or an asymmetric non-linear resistor. In particular, the state of the junction is capable of being altered by the application of a first voltage and sensed by the application of a second, non-destructive voltage.

The WO patent application discloses a nano-scale flash memory comprising drain and source regions in a plurality of approximately parallel first wires; gate electrodes in a plurality of approximately parallel second wires, the second wires crossing the first wires to form an array of nano-scale transistors. Each transistor can be a configurable transistor or a switch memory bit, set by the application of a voltage. The crossed wire transistors can be formed in a crossbar array.

The existing crossbar memories are usually manufactured by lithography tools, but the most advanced techniques are able to produce arrays having pitch of few tens of nano-meters without using electron-beam lithography, but rather controlling layer thicknesses on the nano-meter length scale (NLS) and transforming vertical into horizontal features. This teaching is described in the following publications: N. A. Melosh, A. Boukai, F. Diana, B. Gerardot, A. Badolato, and J. R. Heath, "Ultra High Density Nanowire Lattices and Circuits", Science 300, 112 (2003); M. D. Austin, W. Zhang, H. Ge, D. Wasserman, S. A. Lyon and S. Y. Chou, "6 nm Half-Pitch Lines and 0.04 µm2 Static Random Access Memory Patterns by Nanoimprint Lithography", Nanotechnology 16, 1058-1061 (2005).

It is also known that improvements in terms of resolution and minimum future size of non-volatile memories can be achieved using the Multi-Spacer Pattern Technology (MSPT or S"PT), which is a reiteration of the Space Patterning Technique (SPT) and which is improving with respect to the most advanced lithographic techniques in the realization of repetitive nano-metric architectures. The Multi-Spacer Pattern Technology is a technique through which it is possible to regulate the width of a spacer of a predetermined material (horizontal dimension) by changing the thickness of a thin layer or film, of the same material, deposited on a substrate (vertical dimension).

This technique exploits the possibility to control in an extremely precise way the deposited layer thickness, together with the capacity of many materials to uniformly conform to the topography underlying them.

According to this technique, a seed-block having at least one side wall extending perpendicularly to the substrate is provided. Then, a layer of a suitable material is deposited onto the seed and the substrate and, afterwards, a spacer adjacent to the seed-block side wall is obtained by means of an anisotropic etching of the deposited layer.

The capacity to selectively remove different materials allows further spacers and differently complex structures to be obtained, by subsequent controlled depositions and anisotropic etchings.

In practice, according to this technique, it is possible to realize a structure wherein only one dimension, i.e., the depth, depends on lithography, while the remaining two dimensions, i.e., the height and thickness of the spacer, are obtained by controlling the deposited layer thickness, even within a few nanometers.

An example of a nano-metric architecture obtained by a Multi-Spacer Patterning Technology is disclosed in the publication "A Hybrid Approach to Nanoelectronics", Nanotech. 16 (2005) 1040-1047, to G. F. Cerofolini et al. In this publication, a multispacer structure 1, shown in FIG. 1, results from three repetitions of the Spacer Pattern Technology (S$^3$PT) and comprises a double layer of conductive spacers 2 (in particular, poly-Si) and of insulating spacers 3 (in particular, SiO$_2$). Some realization steps of the multispacer structure 1 are shown in FIGS. 2A-2D, and namely: a) fabrication with the SPT of a first spacer 2 (for example poly-Si) formed on a silicon substrate 4 covered by a field oxide 5, a sacrificial layer having been provided on the field oxide 5 and etched in the form of a seed 6, the edge portion thereof forming the first spacer 2; b) deposition of a conformal layer 7 (for example, SiO2) covering the seed 6 and the first spacer 2; c) anisotropic etching of said conformal layer 7 and fabrication of a second spacer 3 of the material of said conformal layer (SiO2); d) iteration of the steps b) and c). The multispacer structure 1 resulting from above steps comprises a plurality of spacers 2 and 3 (formed, for example, by a double layer of poly-Si/SiO2), whose height is progressively reduced trough slight changes of the S"PT. The final structure is the covered by a final layer, for instance a TEOS layer.

Moreover, examples of cross-bar architectures obtained trough the Multi-spacer pattern Technology are described in the US patent application N. 2006/051946, in the US patent application N. 2006/051919, in which parallel wires are manufactured exploiting the Multi-Spacer Pattern Technology, and in the publication to G F. Cerofolini, D. Mascolo "Strategies for nanoelectronics" appeared in Micr. Eng. 81 (2005) 405-419 (Aug. 8, 2005).

Using S"PT technique, it is possible to arrange two perpendicular arrays of spacers on different parallel planes, obtaining cross structures with cross-point densities of $10^{10}$-$10^{11}$ cm$^2$. Moreover, if the inter-array distances are controlled and kept on the sub Nanometer Length Scale (NLS), then it is possible to use some known functional molecules as a switch between the two arrays, so as to obtain a memory kernel with density of the order of 0.1 Tbit/cm2. Some examples of this methodology are described in the following publication: G F. Cerofolini, D. Mascolo, "Strategies for nanoelectronics" Micr. Eng. 81 (2005) 405-419 (Aug. 8, 2005); "A Hybrid Approach to Nanoelectronics", in which the technique is adopted for hybrid CMOS-Molecule crossbar memory.

Nevertheless, the real problem of these devices is to access to the functionalized cross-points and, consequently, to read, confirm or modify the information contained in the memory cells hosted by the cross-points. Therefore the construction of fully nano-scale memory and logic array requires a sort of interface to individually address, probe and change the state of the cross-point devices.

Another aspect to consider is that a functionalized nano-scale crossbar can be used for different applications. For example, for a cross-bar architecture comprising one or few molecules bridging two nanometer-sized electrodes, it should be possible to characterize the electrical behavior knowing only which cell is addressed. So, for this kind of application, used for studying the intrinsic conductance of molecules and the interaction with the contacts, it is not important to know neither the crossbar density nor pitch.

Another possible application relates to the use of a functionalized nano-scale crossbar as a memory, as described in the publication: Y. Luo, C. P. Collier, J. O. Jeppesen, K. A. Nielsen, E. Delonno, G. Ho, J. Perkins, H.-R. Tseng, T. Yamamoto, J. F. Stoddart, and J. R. Heath, Chem. Phys. Chem. 3, 519 (2002). In this case, all memory cells are accessed, namely they are sensed and modified, without necessarily knowing their position in the crossbar arrangement. Instead, the memory cells should not be necessarily addressed, namely it is not necessary to sense and to modify a state of a crosspoint device in any specified position within the crossbar arrangement. For this kind of application, in which the memory cells' local density is small (but not so small as to render impossible probing the state of the memory cell with integrated sense amplifiers), a hardware demultiplexing device is used that has a density which is comparable with the memory one.

It is also possible to use a nano-scale crossbar as a sensor. This application is mainly addressed to biology. For instance, as described in the publication: L. Hood, J. R. Heath, M. E. Phelps, and B. Lin, Science 306, 640 (2004), microfluidic and nanotechnologic platforms are candidates for preventative medicine. Moreover, in the publication to G. F. Cerofolini, G. Ferla, and A. Foglio Para, in Giornale di Fisica 23, 863 (1982), it is shown how a suitably functionalized crossbar could able to probe the membrane of cells with a resolution on the Nanometer Length Scale (NLS). So, for this application, differently from the above described, it should be necessary to know the memory cells' address and their spatial definition, for example in order to map exactly the probed device surface, and it should be necessary to know the memory cell's actual density.

A consequence of the above examples of application of a nano-scale crossbar structure is that the strategy for addressing a crossbar arrangement is application driven. In addition, for addressing a crossbar arrangement it is necessary to link the cross-points of a crossbar memory to some external regions lithographically defined. But this operation involves some important logic, topologic and technological problems, such as an appreciable loss of bit density. The 1:1 connection between sub-lithographic structures and lithographic structures necessarily involves integration losses.

Some methods are disclosed to solve these problems. A first method is disclosed in the U.S. Pat. No. 6,256,767. This document discloses a demultiplexer and a demultiplexing method for a two-dimensional array of a plurality of nanometer-scale switches (molecular wire crossbar network). This document describes a diode- or resistor-based demultiplexer which connects N nano-wires with $5[\log_2(N)]$ photolithographic micro-wires. Some randomly distributed metal nano-particles should be deposited over the region of intersection between the control and address wires, and this causes a strict control of the related density. Another drawback of this method is that imprecisely localized nano-particles will lead to intermediate values, altering the individuation of the nano-wires being connected.

Another addressing method is shown in the publication by A. DeHon, P. Lincoln and J. Savage in IEEE Trans. Nanotechnol 3, 165 (2003) and in the WO patent N.2005/029498, which are incorporated by reference herein in their entireties. According to the method disclosed therein, individual nano-wires are addressed trough control micro-wires. The method exploits doped nano-wires acting as field effect transistor, thus allowing the integration of logic gates along a nano-wire itself. The method is based on a "modulation doping" technique, consisting in regulating the doping profile of a nano-scale wire along its axis in order that the threshold voltage of the whole nano-wire can be effectively controlled under the application of a voltage (the same happens in a field effect transistor). So the modulation doping allows an address to be built into a nano-scale wire simply modulating opportunely the doping profile along the wire axis. This can be done during the wire growth phase by controlling the concentration of dopants inside the growth atmosphere at appropriate time. In this way each nano-wire can be associated with a code word. An individual nano-wire which is initially in the non-conducting state, will conduct only if all the control regions are field- or voltage-addressed. So, when a coded nano-wire is aligned across a set of micro-wires, the current flow through the nano-wire can be univocally controlled by the voltage applied at the micro-scale level. The nano-wire behaves as logical equivalent of a multi-input AND gate. However, this technique has the drawback that it is not possible to align the nano-wires, which are randomly assembled over microwires.

A third method is described in the publication to R. Beckman, E. Johnstorn-Halperin, Y. Luo, J. E. Green, J. R. Heath "Bridging dimensions: Demultiplexing ultrahigh-density nanowire circuits", Science vol. 310, page 465, 21 Oct. 2005. This last method is similar to the latter described, but exploiting NOR-logic configuration of nano-wires.

All the known techniques described above make the control of cross-point devices formed by the nano-wires possible through the integration of a hardware demultiplexer in the Nanometer Length Scale (NLS). As a consequence, even if these solutions allows each device to be sensed, they have the drawbacks of increasing the device area and of reducing the memory density, causing a big limitation for the scaling of non-volatile memories realized by cross-bar nanometric architectures.

BRIEF SUMMARY

One embodiment of this invention is directed to a method having structural and functional characteristics which allow the demultiplexing of a cross-bar non-volatile memory in a reduced demultiplexing area, in this way overcoming the limits which still affect the devices realized according to the prior art.

In particular, such a method allows to demultiplex a cross-bar non-volatile memory obtained by using a multispacer structure.

One embodiment of this invention also relates to a device for demultiplexing a cross-bar non-volatile memory obtained by using a multispacer structure.

The characteristics and advantages of the present invention will be apparent from the following description of embodiments thereof given by way of indicative and non limiting example with reference to the annexed drawings.

DETAILED DESCRIPTION

It is worth noting that the above figures are not drawn to scale but they are realized so as to emphasize the characteristics of an embodiment of the invention which, advantageously, can be put into practice by using some of the usual techniques used in the nano-manufacturing field, in particular the Multi-Spacer Patterning Technology (S"PT), as it will be more apparent hereafter in the description.

Figure 1:
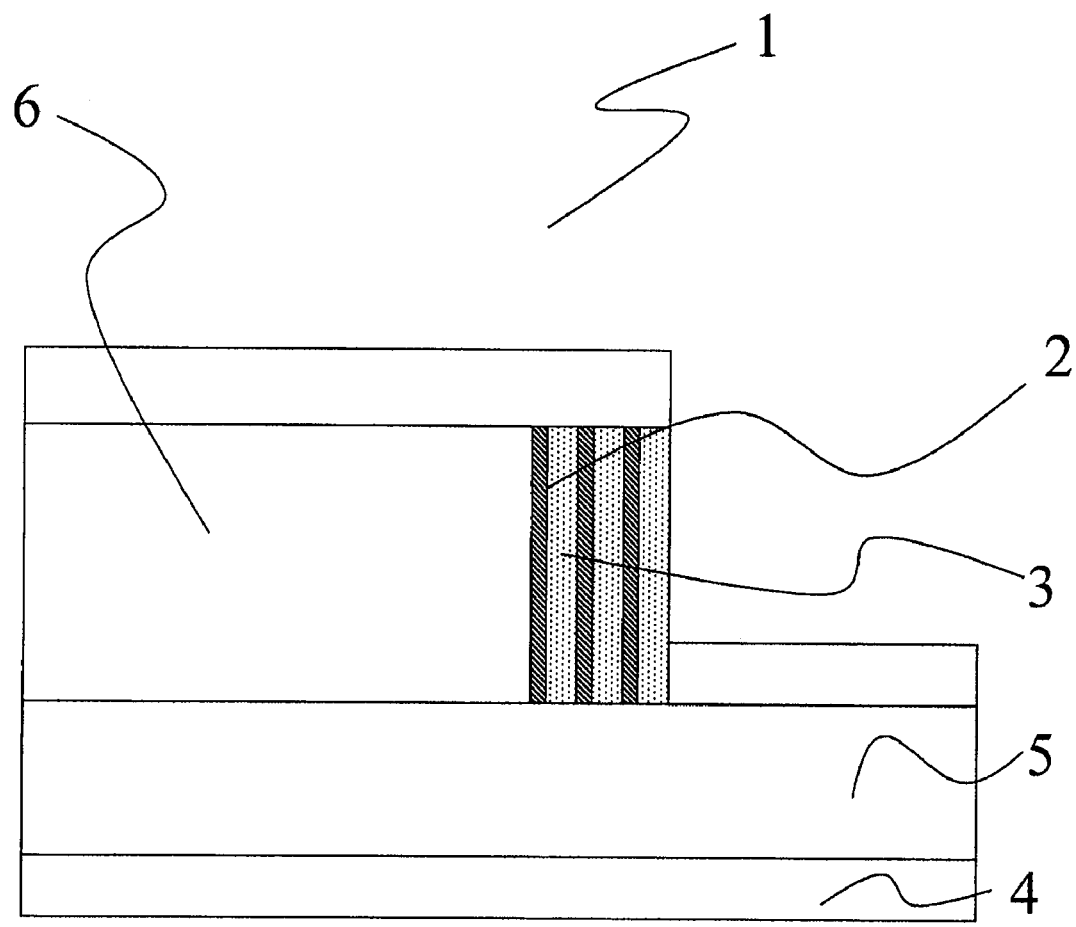
FIG. 1 shows a Transmitted Electronic Microscopy (TEM) of a multispacer structure 1 obtained with S"PT technique according to the prior art.
Figure 2A:
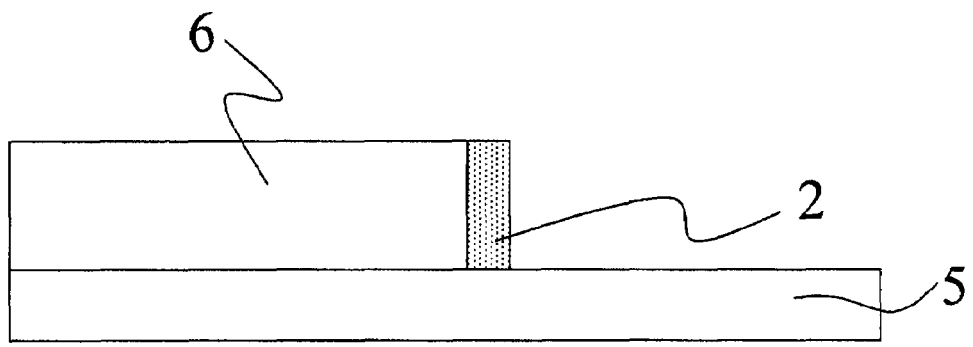
FIG. 2 (A-D) shows some realization steps of the multispacer structure 1 of FIG. 1 according to the prior art.
Figure 2B:
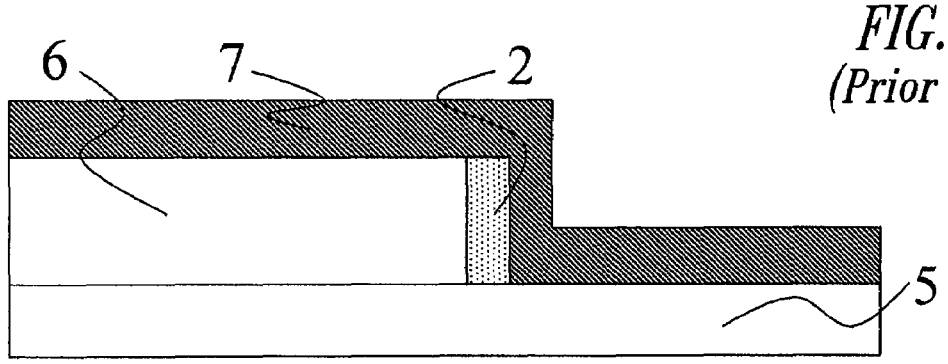
Figure 2C:
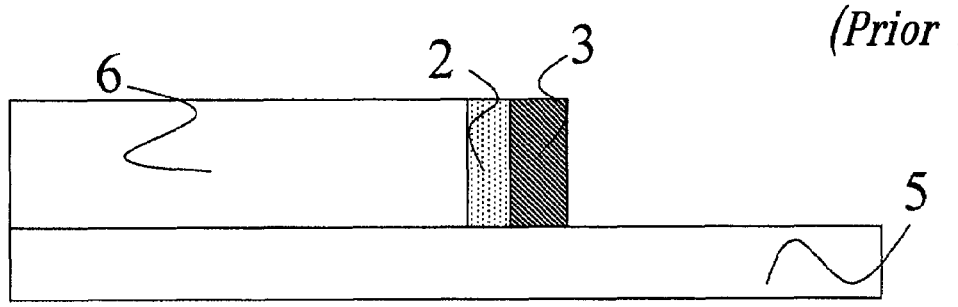
Figure 2D:
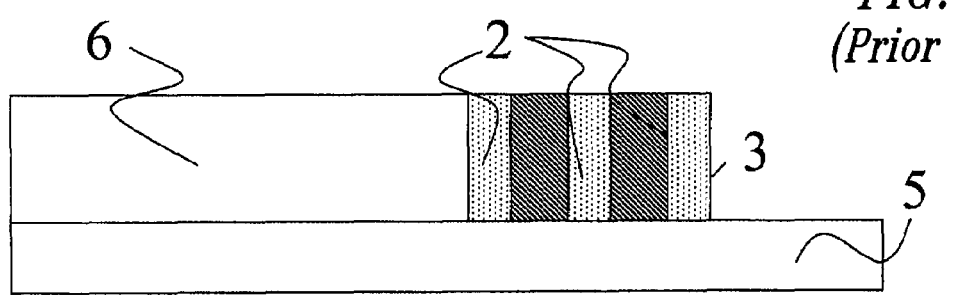
Figure 3:
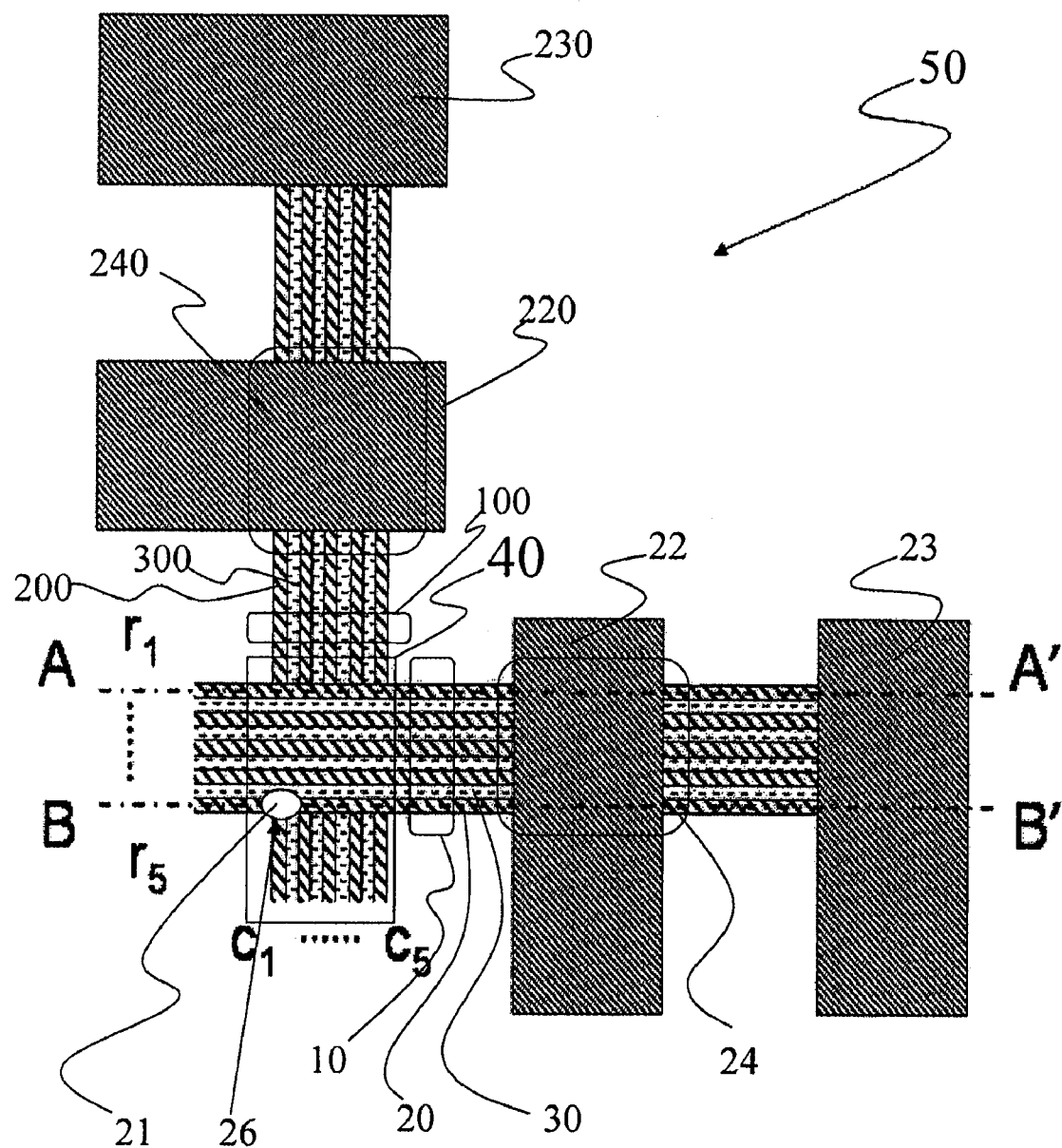
FIG. 3 shows a plan view of a device 50 for demultiplexing a cross-bar non-volatile memory 40, obtained by using the method according to one embodiment of the invention.

With reference to such figures, and in particular to FIG. 3 generally shown at 50 is a device for demultiplexing a cross-bar non-volatile memory 40, which is realized with a multispacer structure similar to the multispacer structure 1 of FIG. 1, obtained by using the method, according to an embodiment of the invention.

To structurally and/or functionally equal elements with respect to the structure described in the prior art section, same reference numbers will be applied.

The device 50, shown in the FIG. 3, comprises the cross-bar non-volatile memory 40 including a first array 10 of parallel nano-wires and a second array 100 of parallel nano-wires orthogonal to the first array 10, the nanowires being formed by the spacers of a multispacer structure, realized trough the Multi-Spacer Pattern Technology, and having heights progressively reduced at each reiteration of the Spacer Pattern Technology. More particularly the first array 10 and the second array 100 include respectively a plurality N of conductive nano-wires 20 and 200, for example polysilicon made, separated respectively by insulating nano-wires 30 and 300, for example silicon oxide made. The conductive nano-wires 20 are defined as the addressable rows (for example, the r1 . . . r5 shown in the FIG. 3) and the conductive nano-wires 200 are defined as the addressable columns (for example, the c1 . . . c5 shown in the FIG. 3) of the cross-bar non-volatile memory 40. Their orthogonal intersection defines a plurality N×N of cross-points 21, where are located memory cells 26 that can switch from the OFF state to the ON state and vice versa. In a preferred embodiment, the conductive nano-wires have a thickness comprised between 50 and 200 nm.

The first array 10 and the second array 100 form a nano-region of the cross-bar non-volatile memory 40, this nano-region being electrically connected through conductive metal to standard electronic components not shown in the figures and are selectively addressable via respective electrodes. In particular, the row nano-wires 20 are selectively addressable via a first photo-lithographically defined conductive electrode 22, and the column nanowires 200 via a second photo-lithographically defined conductive electrode 220. The first electrode 22 and the second electrode 220 form a micro-region of the cross-bar non-volatile memory 40 and the electrical connecting between the nano-region and the external electronic components is obtained through contacts. In particular, a first single photo-lithographically defined contact 23 electrically contacts all the row nano-wires 20, and a second single photo-lithographically defined contact 230 electrically contacts all of the column conductive nano-wires 200. The row nano-wires 20 and the column nano-wires 200 run respectively below the first electrode 22 and the second electrode 220 and are separated from them by an insulator layer 27 of a thickness, for instance between 10 and 50 nm.

Figure 4:
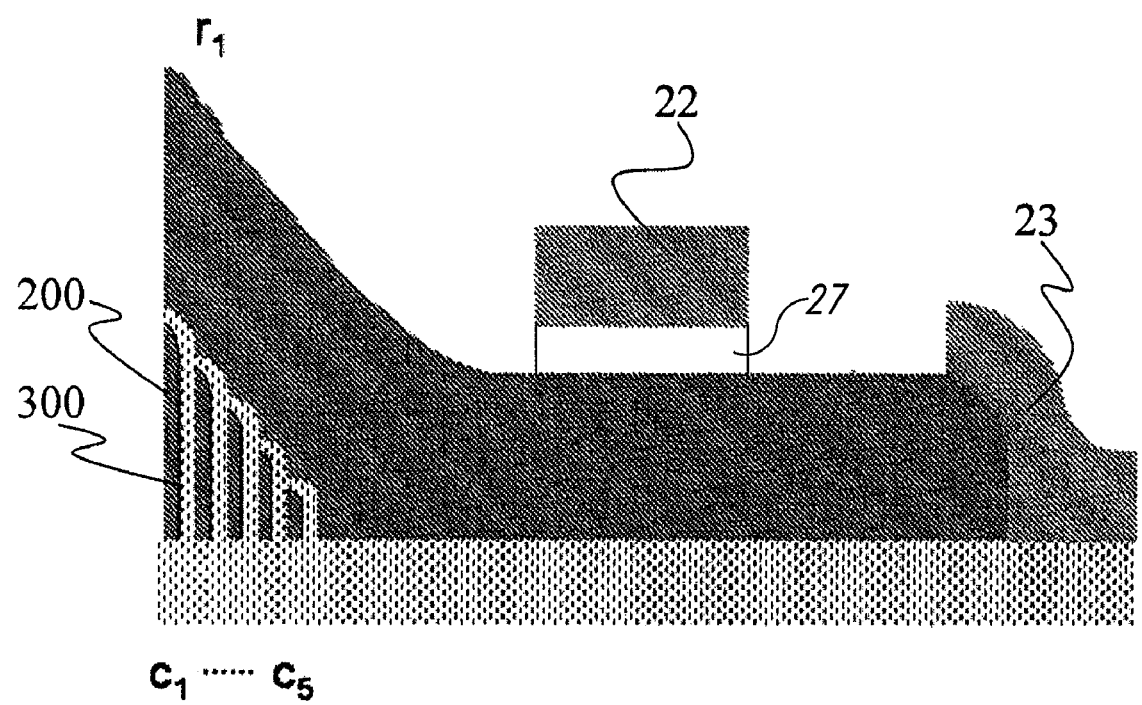
FIGS. 4 and 5 show the device 50, in section view along plane AA' and along plane BB', according to one embodiment of the invention.
Figure 5:
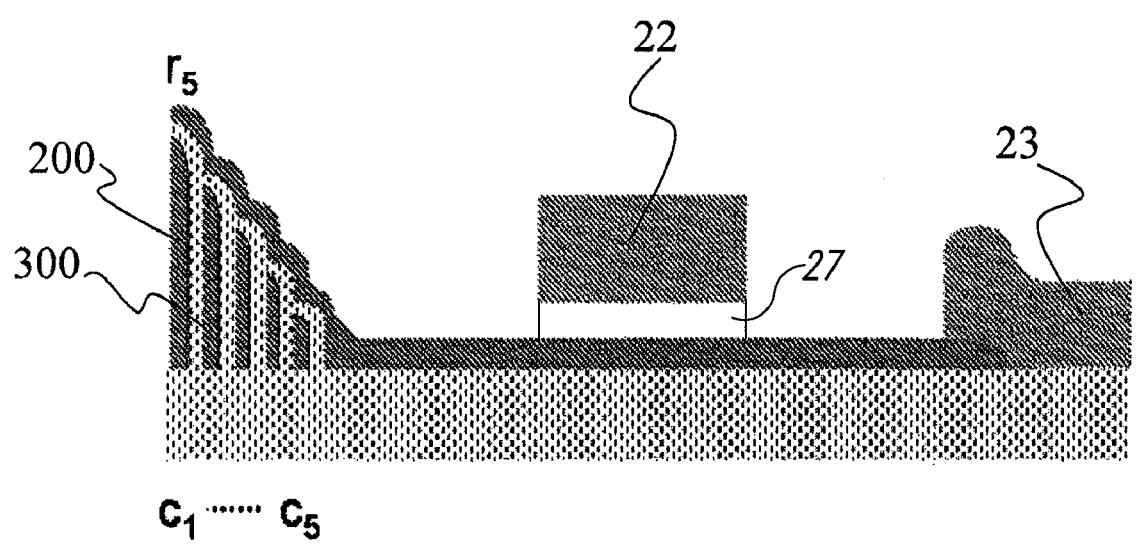

FIGS. 4 and 5 show the cross-bar non-volatile memory 40, in section view along plane AA' and along plane BB', respectively. In particular, FIG. 4 shows the section view for the highest row nano-wire of the array 10 and FIG. 5 shows the section view for the lowest row nano-wires of the array 10, the height of each wire decreasing as a function of the manufacturing sequence thereof.

Figure 6:
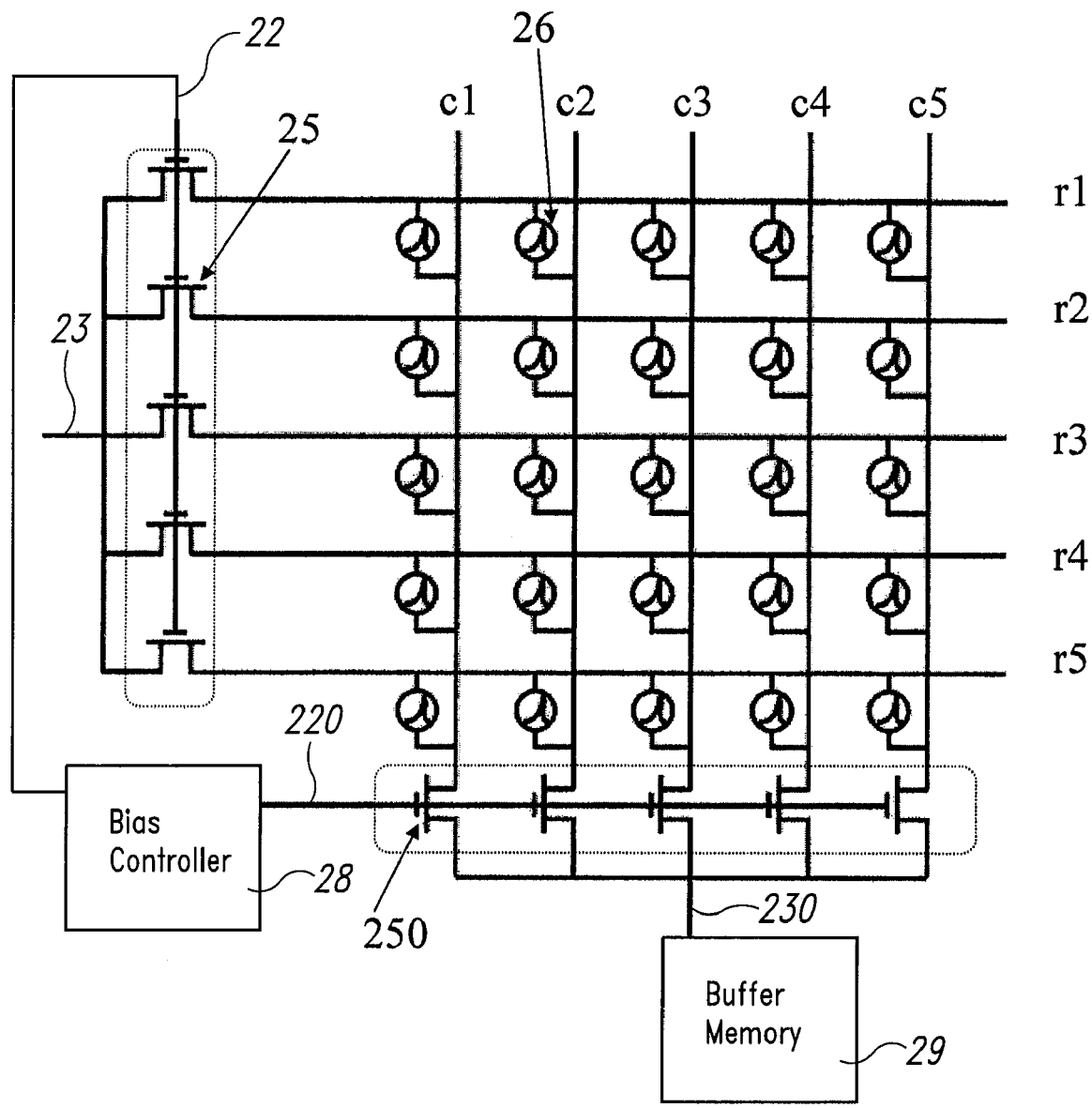
FIG. 6 schematically shows a circuital architecture electrically equivalent to the device 50, according to one embodiment of the invention.

As shown in FIG. 3, a region 24 of the array 10 running under the first electrode 22 and a region 240 of the array 100 running under the second electrode 220 comprise respectively a portion of the row nano-wires and a portion of the column nano-wires, whose doping concentration has been modulated, for instance via ion implantation, in order to form respectively a plurality N of FET transistors 25 and 250, as shown schematically in FIG. 6. The transistors 25 and 250 have respectively the first electrode 22 and the second electrode 220 as control gates.

The configuration so obtained allows implementing a method for demultiplexing the cross-bar non-volatile memory 40 based on the interactions between the transistors 25 and 250 respectively with the first electrode 22 and the second electrode 220.

For example, it is possible to read the cross-bar memory 40 by addressing the state of each of the memory cells 26 corresponding to the cross-points formed by each row and each column progressively considered. This is made possible because each of the transistors 25 and 250 has a threshold voltage value $V_{th}$ which depends on the thickness and on the doping concentration of the portion of the row nano-wires 20 comprised in the region 24 and the column nano-wires 30 comprised in the region 240. As a consequence, it is possible to bias the first electrode 22 and the second electrode 220 respectively with an adjustable voltage value $V_{22}$ and with an adjustable voltage value $V_{220}$, able to allow the transistors 25 and 250 to conduct progressively one by one using a bias controller 28 (FIG. 6) coupled to the electrodes 22, 220.

Just for example, if the first electrode 22 is biased by the bias controller 28 with a first voltage value $V^1_{22}$ bigger than the threshold voltage value $V_{th1}$ of the first of the transistors 25 and smaller than the threshold voltage values $V_{th(N-1)}$ of the others (N−1), and the second electrode 220 is biased by the bias controller 28 with a first voltage value $V^1_{220}$ bigger than the threshold voltage value $V_{th1}$ of the first of the transistors 250 and smaller than the threshold voltage values $V_{th(N-1)}$ of the others (N−1), only the first of the transistors 25 and the first of the transistors 250 are enabled to conduct. This conduction causes only the first of the row nano-wires 20 and of the column nano-wires 200 to not be totally depleted and enables only the memory cell located in the cross-point (1,1) at the intersection between the first of the row nano-wires 20 and of the column nano-wires 200, to switch from its OFF state to its ON state. In this situation a current flows from the first contact 23 to the second contact 230 and its value $I_{(1,1)}$ is related to the conduction state of only the memory cell located in the cross-point (1,1).

After this, the electrode 220 is biased with a second voltage value $V^2_{220}$ bigger than the threshold voltage values $V_{th1}$ and $V_{th2}$ of the first and the second of the transistors 250 and smaller than the threshold voltage values $V_{th(N-2)}$ of the others (N−2), enabling also the second of the column nano-wires 30 to conduct. Now, also the memory cell located in the cross-point (1,2), at the intersection between the first of the row nano-wires 20 and the second of the column nano-wires 200, is enabled to switch from the OFF state to the ON state and a new current flows from the first contact 23 to the second contact 230, this current having a value $I_{(1,2)}$. Then the total current value $I_{TOT}$ is the sum of the current values $I_{(1,1)}$ and $I_{(1,2)}$, and if the first current-value $I_{(1,1)}$ is memorized, for example, in a buffer memory 29 coupled to the second contact 230 (FIG. 6), the current value $I_{(1,2)}$ is obtained as the difference between the current value $I_{TOT}$ and the current value $I_{(1,1)}$. This current value $I_{(1,2)}$ provides the conduction state of the memory cell located at the cross-point (1,2). Of course, the buffer memory could alternatively be coupled at the first contact 23 rather than the second contact 230.

A reiteration of this methodology allows the progressive conduction of each of the transistors 250, one by one, depending on an incrementing of the voltage values $V_{220}$. In the same manner, the progressive conduction of each of the transistors 25, one by one, is enabled by an increasing voltage value $V_{22}$.

Generalizing, the reading operation by rows of the cross-bar memory 40 is obtained through the application of the N different voltage values $V^1_{22} \ldots V^N_{22}$ to the first electrode 22. For enabling the reading of a row i the first electrode is biased with a voltage value $V^i_{22}$ which is bigger than the threshold voltage values $V_{thi}$ of the i-th of the transistor 25 and of the threshold voltage values $V_{th1} \ldots V_{th(i-1)}$ of all the 1-th ... (i−1)th, preceding the i-th in the row array 10, and smaller than the threshold voltage values $V_{th(i+1)} \ldots V_{thN}$ of all the (i+1)-th ... N-th of the transistors 25, following the i-th in the row array 10. Then the columns are enabled one by one, setting the voltage value $V_{220}$ of the second electrode 220 with the N different voltage values $V^1_{220} \ldots V^N_{220}$, progressively bigger than the threshold voltage values $V_{th1} \ldots V_{thN}$ of the 1-th ... N-th of the transistors 250.

In a similar way, the reading operation per column can be realized inverting the role of the first and the second electrodes.

The progressive conduction of each of the transistors 25 and 250 enables each memory cell located in each cross-point progressively to switch from the OFF state to the ON state. As a consequence, the total current value $I_{TOT}$ is a sum of (N×N) contributions of current values $I_{(i,j)}$, originated by the addressing of the row i and the column j, related to the conduction state of a generic memory cell located in a generic cross-point (i,j) and progressively coupling the first contact 23 to the second contact 230.

At the end, every information on the state of the memory cells 26 can be memorized, for example in the buffer memory 29, which has a number of bits equal to the number of the row and column nano-wires of the cross bar memory.

In another embodiment of the invention, a different threshold voltage between different memory cells can be obtained doping a p-type column nano-wire and an n-type row nano-wire with different concentrations.

The main advantage of the method described above is that of demultiplexing a sub-lithographic cross-bar non-volatile memory, namely addressing, sensing and controlling the state of its memory cells, exploiting a multi-spacer structure. In fact, such a structure is particularly suitable to be used in nano-scale circuit architectures.

Advantageously, the method and the device for demultipling a cross-bar non-volatile memory are particularly economic and simple to realize, beside being of quick execution.

Still advantageously, the method and the device thus obtained will be provided with high resolution and high regularity.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method for demultiplexing a crossbar non-volatile memory, comprising:
   providing a crossbar non-volatile memory including a first array of addressable row nano-wires and a second array of addressable column nano-wires crossing said addressable row nano-wires at a plurality of cross-points hosting a plurality of memory cells;

providing a first electrode and a second electrode, respectively crossing a doping modulated portion of said row nano-wires and a doping modulated portion of said column nano-wires;

providing a first contact and a second contact electrically contacting respectively said row nano-wires and said column nano-wires;

progressively biasing said first electrode and said second electrode respectively with first and second adjustable voltage values enabling a progressive switching of said memory cells from an OFF state to an ON state; and memorizing said memory cells state.

2. The method of claim 1, wherein said first and second adjustable voltage values enable reading each addressable row and column nano-wire.

3. The method of claim 1, wherein said doping modulated portions comprise respectively a plurality of row transistors and a plurality of column transistors formed respectively by said row nano-wires with said first electrode as a row control gate and by said column nano-wires with said second electrode as a column control gate.

4. The method of claim 3, wherein each of said transistors has a threshold voltage value which is function of a thickness and of a doping concentration of a nano-wire comprised in said portion.

5. The method of claim 3, wherein said first and second adjustable voltage values enable respectively a progressive one by one conduction of said transistors.

6. The method of claim 5, wherein a voltage value of said first adjustable voltage values is bigger than the threshold voltage values of one or more of said row transistors, and smaller than the threshold voltage values of a remaining portion of said row transistors.

7. The method of claim 5, wherein a voltage value of said second adjustable voltage values is bigger than the threshold voltage values of one or more of said column transistors, and smaller than the threshold voltage values of a remaining portion of said column transistors.

8. The method of claim 1, wherein said first and second adjustable voltage values comprise respectively N voltage values and N voltage values.

9. The method of claim 1, wherein said adjustable voltage values enable a memory cell located in the cross-point to switch from the ON state to the OFF state.

10. The method of claim 1, wherein said switching causes a current value to flow from said first contact to said second contact.

11. The method of claim 1, wherein said progressive switching of the state of said memory cells causes a total current value equal to the sum of contributions of a current value from each activated memory cell to flow in the nano-wires.

12. The method of claim 1, wherein said memorizing comprises memorizing contributions of a current value in a buffer memory having a number of bits equal to a number of row nano-wires multiplied by a number of column nano-wires.

13. The method of claim 1, wherein said memory cells are molecules acting as Schmidt triggers.

14. A device for demultiplexing a crossbar non-volatile memory, comprising:

a crossbar non-volatile memory including a first array of addressable row nano-wires and a second array of addressable column nano-wires crossing said addressable row nano-wires at a plurality of cross-points hosting a plurality of memory cells;

a first electrode and a second electrode respectively crossing a doping modulated portion of said row nano-wires and a doping modulated portion of said column nano-wires;

a first contact and a second contact electrically contacting respectively said row nano-wires and said column nano-wires; and a bias controller coupled to the first and second electrodes, the bias controller being structured to program respectively said first electrode and said second electrode with first and second adjustable voltage values, respectively, thereby progressively switching one by one said memory cells from an OFF state to an ON state.

15. The device of claim 14, wherein said row and column nano-wires are conductive spacers of a multispacer structure, said spacers having a height decreasing at each reiteration of a Spacer Pattern Technique.

16. The device of claim 14, wherein said row and column nano-wires have a thickness comprised between 50 and 200 nm.

17. The device of claim 14, wherein each of said row and column nano-wires is separated from another by an insulating nano-wire.

18. The device of claim 14, wherein said first and second electrodes and said first and second contacts are conductive and photo-lithographically defined.

19. The device of claim 14, wherein said first and second electrodes are separated from said row and column nano-wires, respectively, by an insulator layer.

20. The device of claim 14, further comprising a buffer memory coupled to at least one of the contacts and structured to memorize an electrical quantity corresponding to a state of one of the memory cells being read.

21. A method comprising:

activating a first row nano-wire by applying a row control voltage to a row control electrode insulated from and crossing a group of row nano-wires that includes the first row nano-wire;

activating a first column nano-wire by applying a column control voltage to a column control electrode insulated from and crossing a group of column nano-wires at a plurality of cross-points at which respective memory cells are formed, the group of column nano-wires including the first column nano-wire;

sequentially varying the row control voltage to sequentially activate a sequentially varying number of the row nano-wires;

sequentially varying the column control voltage to sequentially activate a sequentially varying number of column nano-wires; and sensing a conduction state of one or more of the memory cells based on a total current flowing in the groups of nano-wires as the control voltages are varied.

22. The method of claim 21 wherein sensing a conduction state comprises comparing a total current prior to a change in the control voltage to a total current after a change in the control voltage.

23. The method of claim 21 wherein activating the first row nano-wire comprises turning on a transistor formed by the first row nano-wire with the row control electrode being a gate electrode of the transistor.

* * * * *

UNITED STATES PATENT AND TRADEMARK OFFICE
CERTIFICATE OF CORRECTION

PATENT NO. : 7,492,624 B2
APPLICATION NO. : 11/771920
DATED : February 17, 2009
INVENTOR(S) : Danilo Mascolo et al.

It is certified that error appears in the above-identified patent and that said Letters Patent is hereby corrected as shown below:

On the title of the Patent
Item (57) Abstract, line 8, "first contact and a second contact respectively the" should read as -- first contact and a second contact respectively contact the --

Column 8
Line 65, "providing a crossbar non-volatile memory including a first" should read as -- providing the crossbar non-volatile memory including a first --

Column 9
Line 14, "memorizing said memory cells state" should read as -- memorizing said memory cells' state --

Lines 25-26, "has a threshold voltage value which is function of a thickness and of a doping concentration of a nano-wire comprised in" should read as -- has a threshold voltage value which is a function of a thickness and of a doping concentration of a nano-wire comprised in --

Lines 32-33, "first adjustable voltage values is bigger than the threshold voltage values of one or more of said row transistors," should read as -- first adjustable voltage values is bigger than threshold voltage values of one or more of said row transistors, --

Lines 34-35, "smaller than the threshold voltage value of a remaining portion of" should read as -- smaller than threshold voltage value of a remaining portion of --

Lines 37-38, "second adjustable voltage values is bigger than the threshold voltage values of one or more of said column transistors," should read as -- second adjustable voltage values is bigger than threshold voltage values of one or more of said column transistors, --

UNITED STATES PATENT AND TRADEMARK OFFICE
CERTIFICATE OF CORRECTION

PATENT NO. : 7,492,624 B2
APPLICATION NO. : 11/771920
DATED : February 17, 2009
INVENTOR(S) : Danilo Mascolo et al.

It is certified that error appears in the above-identified patent and that said Letters Patent is hereby corrected as shown below:

Lines 39-40, "smaller than the threshold voltage value of a remaining portion of" should read as -- smaller than threshold voltage value of a remaining portion of --

Line 45, "a memory cell located in the cross-point to" should read as -- a memory cell located in a cross-point to --

Line 63, "a crossbar non-volatile memory including a first array of" should read as -- the crossbar non-volatile memory including a first array of --

Signed and Sealed this

Second Day of June, 2009

JOHN DOLL
*Acting Director of the United States Patent and Trademark Office*